(12) United States Patent
He et al.

(10) Patent No.: US 11,366,021 B2
(45) Date of Patent: Jun. 21, 2022

(54) TEMPERATURE DETECTING DEVICE, TEMPERATURE DETECTING SYSTEM AND TEMPERATURE DETECTING METHOD

(71) Applicants: HEFEI BOE VISION-ELECTRONIC TECHNOLOGY CO., LTD., Anhui (CN); BOE TECHNOLOGY GROUP CO., LTD., Beijing (CN)

(72) Inventors: Kai He, Beijing (CN); Lizhi Peng, Beijing (CN); Man Liu, Beijing (CN)

(73) Assignees: HEFEI BOE VISION-ELECTRONIC TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 442 days.

(21) Appl. No.: 16/425,468

(22) Filed: May 29, 2019

(65) Prior Publication Data
US 2020/0132555 A1   Apr. 30, 2020

(30) Foreign Application Priority Data

Oct. 30, 2018   (CN) .......................... 201811279687.1

(51) Int. Cl.
*G01K 7/01*     (2006.01)
*G05D 23/19*    (2006.01)
*H01L 23/552*   (2006.01)

(52) U.S. Cl.
CPC .............. *G01K 7/01* (2013.01); *G05D 23/19* (2013.01); *G05D 23/1928* (2013.01); *G05D 23/1931* (2013.01); *H01L 23/552* (2013.01)

(58) Field of Classification Search
CPC ...... G01K 7/01; G05D 23/19; G05D 23/1928; G05D 23/1931; H01L 23/552; Y10S 901/02; Y10S 901/15; Y10S 901/36; G01N 2201/10; G01N 2223/321
USPC ................ 374/208, 154, 153, 195, 198, 200
See application file for complete search history.

(56) References Cited

U.S. PATENT DOCUMENTS

| 2,662,406 A | * | 12/1953 | Wohlgemuth | ........... G01K 7/12 374/181 |
| 4,379,461 A | * | 4/1983 | Nilsson | ................... A61B 5/015 346/33 ME |
| 4,518,307 A | * | 5/1985 | Bloch | .................. B25J 17/0208 414/729 |
| 4,523,100 A | * | 6/1985 | Payne | .................... B25J 9/1015 250/559.33 |
| 5,011,297 A | * | 4/1991 | Tittl | ..................... G01B 5/0014 33/560 |
| 5,059,032 A | * | 10/1991 | Mack | .................... G01J 5/0893 374/29 |

(Continued)

FOREIGN PATENT DOCUMENTS

EP          3492214 A1  *  6/2019  ........... B23K 31/125

*Primary Examiner* — Gail Kaplan Verbitsky

(57) ABSTRACT

Embodiments of the present disclosure discloses a temperature detecting device, a temperature detecting system and a temperature detecting method. The temperature detecting device includes: a bearing support, a first end of the bearing support being fixed; a temperature detector, provided on a second end of the bearing support; a moving component, configured to be connected with the bearing support, wherein the second end of the bearing support is movable with respect to the first end under driving of the moving component.

18 Claims, 3 Drawing Sheets

(56) References Cited

U.S. PATENT DOCUMENTS

| | | | | |
|---|---|---|---|---|
| 5,538,207 | A * | 7/1996 | O'Connell | H02G 1/04 |
| | | | | 182/2.11 |
| 7,267,481 | B2 * | 9/2007 | Rudlaff | G01K 1/146 |
| | | | | 374/141 |
| 8,442,686 | B2 * | 5/2013 | Saito | B25J 3/00 |
| | | | | 700/261 |
| 9,043,011 | B2 * | 5/2015 | Kudas | F01D 5/24 |
| | | | | 700/160 |
| 11,069,547 | B2 * | 7/2021 | Chang | H01L 21/67248 |
| 2010/0272240 | A1 * | 10/2010 | Cochrane | G01N 23/04 |
| | | | | 378/167 |
| 2017/0020615 | A1 * | 1/2017 | Koenig | A61B 34/72 |
| 2017/0052070 | A1 * | 2/2017 | Marsh | G01N 25/72 |

* cited by examiner

| 401 Sending, by a control device, control data for controlling movement of a second end of a bearing support to a moving component, when an assembly to be tested is in operation |
|---|
| 402 Driving, by the moving component, the second end of the bearing support to move based on the control data |

TEMPERATURE DETECTING DEVICE, TEMPERATURE DETECTING SYSTEM AND TEMPERATURE DETECTING METHOD

TECHNICAL FIELD

The present disclosure relates to a temperature detecting device, a temperature detecting system and a temperature detecting method.

BACKGROUND

A Printed Circuit Board (PCB) is an important electronic assembly and is a provider of electrical connections for electronic elements. Usually, a plurality of elements (for example, a chip, an inductor and a triode, etc.) are disposed on a surface of the PCB; and in order to avoid excessively high operating temperatures of respective elements during the operating process of the PCB, which reduces a service life of the PCB, it is necessary to ensure that the operating temperatures of the respective elements in the PCB are within a preset temperature range during a design and development process of the PCB.

At present, after the design of the PCB is completed, a corresponding sample is fabricated, and the operating temperatures of the respective devices are detected while the sample is in operation. If the operating temperatures of the respective devices are all within the preset temperature range, the design of the PCB is reasonable, and mass production may be performed subsequently; otherwise, a redesign needs to be done.

SUMMARY

At a first aspect, an embodiment of the present disclosure provides a temperature detecting device comprises: a bearing support, a first end of the bearing support being fixed; a temperature detector, provided on a second end of the bearing support; a moving component, configured to be connected with the bearing support, and the second end of the bearing support is movable with respect to the first end under driving of the moving component.

Optionally, the bearing support includes a rotating member and a telescopic member, a first end of the rotating member is fixed, a second end of the rotating member is fixedly connected with a first end of the telescopic member, and a second end of the telescopic member is configured to bear the temperature detector.

Optionally, the moving component is respectively coupled to the rotating member and the telescopic member, under the driving of the moving component, the second end of the telescopic member is extendible and retractable, and the rotating member is rotatable, and an extension direction of the rotating member is perpendicular to an extension direction of the telescopic member.

Optionally, the bearing support includes: a first support, a first end of the first support being fixed; a telescopic member, a first end of the telescopic member being rotatably coupled to the first support, and a second end of the telescopic member being provided with the temperature detector.

Optionally, the moving component is coupled to the telescopic member, and under driving of the moving component, the second end of the telescopic member is extendible and retractable, and the second end of the telescopic member is rotatable with respect to the first support.

Optionally, the temperature detecting device further comprises a bearing base configured to bear an assembly to be detected, and the first end of the bearing support is fixed to the bearing base.

Optionally, the temperature detecting device further comprises a control member connected with the moving component and configured to control the moving component, so that the moving component drives the second end of the bearing support to move with respect to the first end.

At a second aspect, an embodiment of the present disclosure provides a temperature detecting system comprises: a temperature detecting device which is the temperature detecting device according to the first aspect; a control device, connected with the moving component in the temperature detecting device, and configured to send control data for controlling movement of the second end of the bearing support to the moving component, and the moving component is configured to drive the second end of the bearing support to move based on the control data.

Optionally, the control device is further configured to: acquire position information of elements to be detected in an assembly to be detected, and generate control data according to the position information.

Optionally, the temperature detecting device further comprises a bearing base configured to bear the assembly to be detected, a first end of the bearing support is fixed to the bearing base, the bearing base has a first reference coordinate system, the assembly to be detected has a second reference coordinate system, during a detection, the first reference coordinate system coincides with the second reference coordinate system, and the position information is coordinate information.

Optionally, the control data includes: a distance of the second end of the bearing support with respect to coordinate origin of the first reference coordinate system and the second reference coordinate system, and an included angle between a connection line from the second end of the bearing support to the coordinate origin and a first axis in the first reference coordinate system.

Optionally, the bearing support includes a rotating member and a telescopic member, a first end of the rotating member is fixedly connected with the bearing base, a second end of the rotating member is fixedly connected with a first end of the telescopic member, a second end of the telescopic member is configured to bear the temperature detector, and an axis of the rotating member passes through the coordinate origin of the first reference coordinate system, and is perpendicular to the first reference coordinate system, and the control data includes a length of the telescopic member, and an included angle between an extension direction of the telescopic member and the first axis of the first reference coordinate system.

Optionally, the assembly to be detected includes N elements to be detected, where N is a positive integer, the control device is configured to sequentially send N pieces of control data in a preset order, the N pieces of control data are in one-to-one correspondence with the N elements to be detected, the moving component is configured to: control movement of the second end of the telescopic member, according to current position information of the second end of the telescopic member and an Mth piece of control data, when receiving the Mth piece of control data, so that an orthogonal projection of the temperature detector on a bearing surface of the bearing base overlaps with an orthogonal projection of an Mth element to be detected on the bearing surface, where M≤N; and the current position information of the second end of the telescopic member includes: a current length of the telescopic member, and a current included angle between the extension direction of the telescopic member and one of axes in the first reference coordinate system.

Optionally, the control device is further connected with the temperature detector, the control device is further configured to: acquire an operating temperature of the element to be detected; judge whether or not the operating temperature of each of the elements to be detected is within a preset temperature range; and mark at least one of the element to be detected whose operating temperature is within the preset temperature range and the element to be detected whose operating temperature is not within the preset temperature range.

Optionally, wherein the bearing support includes: a first support, a first end of the first support being fixed; a telescopic member, a first end of the telescopic member being rotatably coupled to the first support, and a second end of the telescopic member being provided with the temperature detector, a rotation axis of the telescopic member passes through the coordinate origin of the first reference coordinate system and is perpendicular to the first reference coordinate system; the control data includes: a length of the telescopic member, and an included angle between an extension direction of the telescopic member and the first axis of the first reference coordinate system.

At a third aspect, an embodiment of the present disclosure provides a temperature detecting method applied to the temperature detecting system according to the second aspect, the method comprises: sending, by the control device, control data for controlling movement of the second end of the bearing support to the moving component, when an assembly to be detected is in operation; and driving, by the moving component, the second end of the bearing support to move based on the control data.

Optionally, the temperature detecting device further comprises a bearing base configured to bear the assembly to be detected, a first end of the bearing support is fixed to the bearing base, the bearing base has a first reference coordinate system, and the assembly to be detected has a second reference coordinate system, and before the sending, by the control device, control data for controlling movement of the second end of the bearing support to the moving component, the method further comprises: causing the bearing base to move with respect to the assembly to be detected, so that the first reference coordinate system coincides with the second reference coordinate system.

Optionally, before the sending, by the control device, control data for controlling movement of the second end of the bearing support to the moving component, the temperature detecting device further comprises: acquiring position information of each of the elements to be detected on the assembly to be detected; generating the control data according to the position information, the control data including: a distance of the second end of the bearing support with respect to the coordinate origin of the first reference coordinate system and the second reference coordinate system, and an included angle between a connection line from the second end of the bearing support to the coordinate origin and a first axis in the first reference coordinate system.

Optionally, the assembly to be detected is a printed circuit board, the acquiring position information of each of the elements to be detected on the assembly to be detected includes: acquiring position information of each of the elements to be detected on the assembly to be detected from a file which is stored with the position information of the elements to be detected on the printed circuit board; or measuring a position of each of the elements to be detected on the assembly to be detected to obtain position information of each of the elements to be detected on the assembly to be detected.

Optionally, the assembly to be detected includes N elements to be detected, where, N is a positive integer, the sending, by the control device, control data for controlling movement of the second end of the bearing support to the moving component includes configuring the control device to sequentially send N pieces of control data in a preset order, the N pieces of control data being in one-to-one correspondence with the N elements to be detected; the driving, by the moving component, the second end of the bearing support to move based on the control data includes controlling movement of the second end of the bearing support, according to current position information of the second end of the bearing support and an Mth piece of control data, when receiving the Mth piece of control data, so that an orthogonal projection of the temperature detector on a bearing surface of the bearing base overlaps with an orthogonal projection of an Mth element to be detected on the bearing surface, where M≤N, the current position information of the second end of the bearing support includes a distance of the second end of the bearing support with respect to the coordinate origin of the first reference coordinate system and the second reference coordinate system, and the included angle between the connection line from the second end of the bearing support to the coordinate origin and the first axis in the first reference coordinate system.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
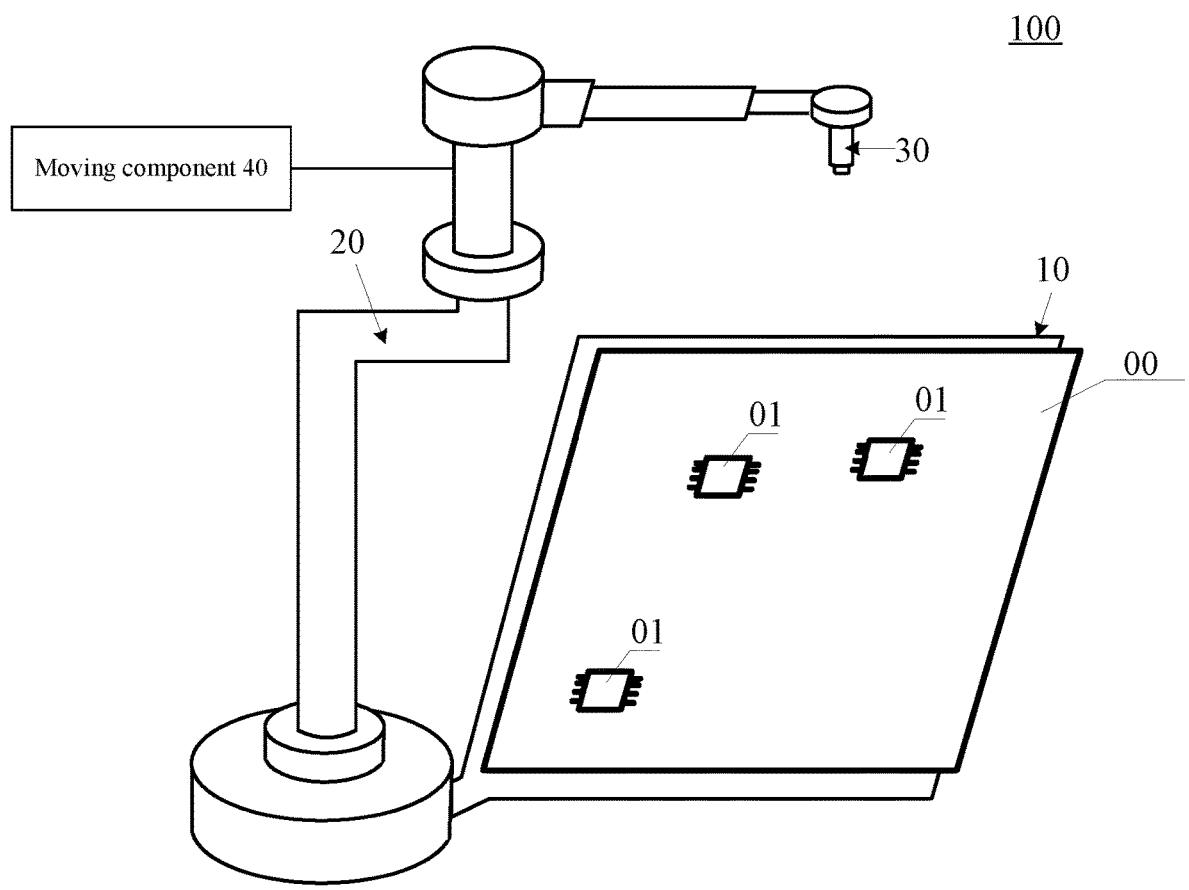
FIG. 1 is a structural schematic diagram of a temperature detecting device provided by an embodiment of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Embodiments of the present disclosure will be in detail described hereinafter, and examples of the embodiments are shown in the drawings, in which the same or similar reference number is denoted as the same or similar members or the members with the same or similar function throughout. The described embodiments in conjunction with the accompanying drawings of the present disclosure are exemplary, only is used to explain the present disclosure and do not intend to limit the present disclosure.

When an operating temperature of an element is detected, it is usually detected by an operator holding an infrared thermometer in hand, or a temperature sensor is coupled to the element, and the operating temperature of the element is detected through a temperature sensing line. However, both detection modes have relatively low detection efficiency.

In order to make objects, technical details and advantages of the present disclosure more apparent, hereinafter, embodiments of the present disclosure will be further described in detail in connection with the drawings.

A temperature detecting device provided by an embodiment of the present disclosure, comprises: a bearing support, a first end of the bearing support being fixed; a temperature detector, provided on a second end of the bearing support; a moving component, configured to be connected with the bearing support, wherein, under driving of the moving component, the second end of the bearing support is movable with respect to the first end of the bearing support.

For example, the temperature detecting device provided by the embodiment of the present disclosure, further comprises: a bearing base, configured to bear an assembly to be detected, the first end of the bearing support being fixed to the bearing base.

With reference to FIG. 1, FIG. 1 is a structural schematic diagram of a temperature detecting device provided by an embodiment of the present disclosure, and the temperature detecting device 100 may comprise: a bearing base 10, a bearing support 20, a temperature detector 30 and a moving component 40.

The bearing base 10 is configured to bear an assembly to be detected, for example, a PCB 00 to be detected. It should be noted that, the temperature detecting device 100 according to the embodiment of the present disclosure is used to test a sample fabricated after design of a circuit board is completed; and therefore, the PCB 00 disposed on the bearing base 10 is just the sample fabricated after the design of the circuit board is completed.

For example, the element to be detected may be any element whose temperature needs to be detected, and is not limited to a PCB.

A first end of the bearing support 20 is fixedly connected with the bearing base, and a second end of the bearing support 20 may bear the temperature detector 30. Optionally, the temperature detector 30 may be an infrared camera.

The moving component 40 is configured to: drive the second end of the bearing support 20 to move when the PCB 00 is in operation, so that the temperature detector 30 detects an operating temperature of each of elements 01 to be detected on the PCB 00. It should be noted that, the PCB 00 may be usually provided thereon with a plurality of elements, for example, chips, inductors and triodes, etc. When the PCB 00 is in operation, these elements will generate heat, and a service life of the PCB 00 is related to operating temperatures of some of these elements; and therefore, when the PCB 00 is in operation, only the operating temperatures of the elements 01 to be detected that affect the service life of the PCB 00 are detected.

In summary, the temperature detecting device provided by the embodiment of the present disclosure, comprises: a bearing base, a bearing support, a temperature detector and a moving component. The bearing base is configured to bear an element to be detected, for example, the PCB; a first end of the bearing support is fixedly connected with the bearing base, and a second end may bear the temperature detector. The moving component is configured to: drive the second end of the bearing support 20 to move when the PCB is in operation, so that the temperature detector detects operating temperatures of respective elements to be detected on the PCB. With the temperature detecting device, the operating temperatures of the respective elements to be detected on the PCB may be automatically detected, so that it is neither necessary for an operator to hold an infrared thermometer in hand so as to detect the operating temperatures of the elements, nor necessary to couple a temperature sensor to each element to detect the operating temperatures of the elements through a temperature sensing line, which effectively improves efficiency in testing the PCB.

Figure 2:
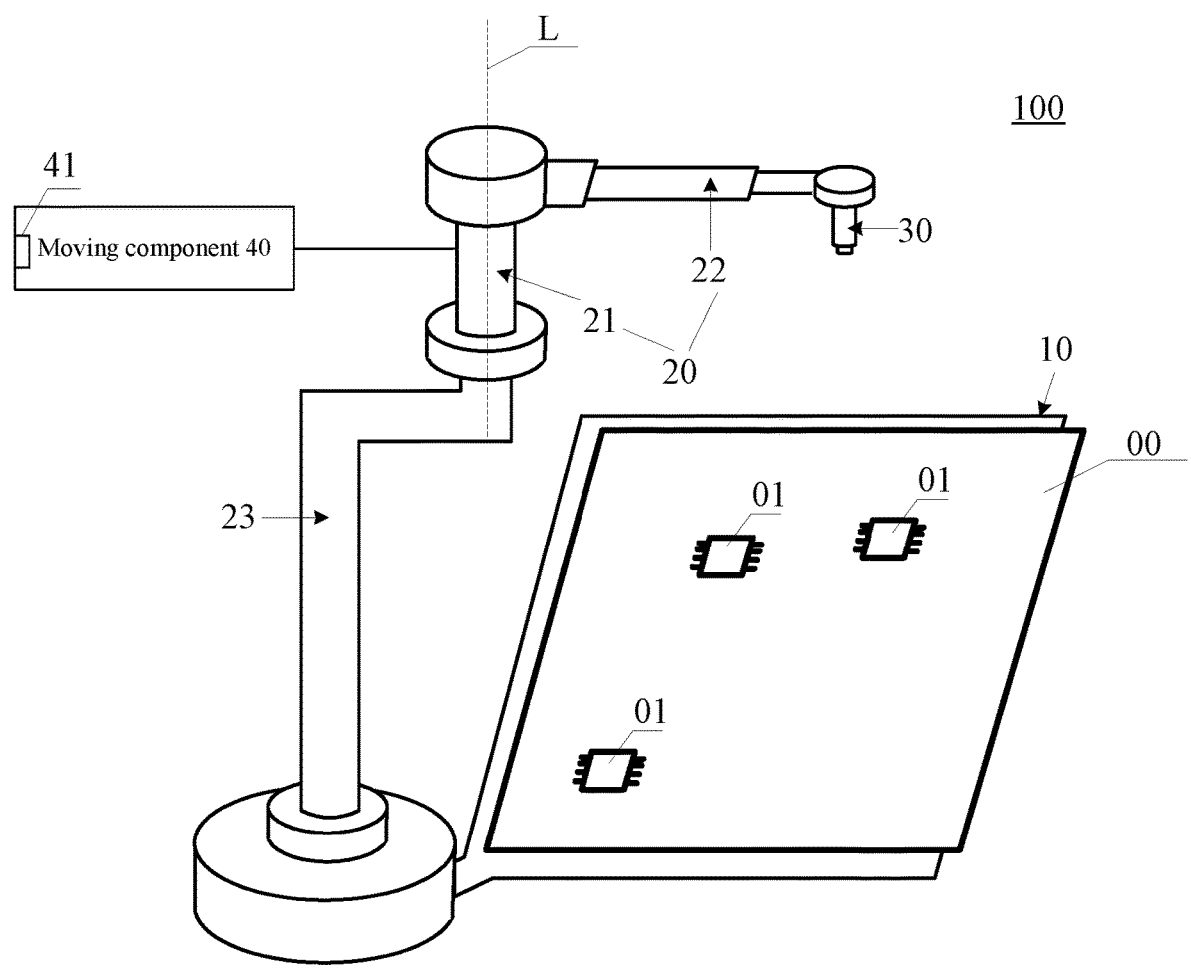
FIG. 2 is a structural schematic diagram of another temperature detecting device provided by an embodiment of the present disclosure.

Optionally, as shown in FIG. 2, FIG. 2 is a structural schematic diagram of another temperature detecting device provided by an embodiment of the present disclosure. The bearing support 20 may include: a rotating member, e.g., a rotating rod 21, and a telescopic member, e.g., a telescopic rod 22; a first end of the rotating rod 21 is fixedly connected with the bearing base 10, a second end of the rotating rod 21 is fixedly connected with a first end of the telescopic rod 22, and a second end of the telescopic rod 22 is configured to bear the temperature detector 30.

For example, the moving component is respectively coupled to the rotating member and the telescopic member; as driven by the moving component, the second end of the telescopic member is extendible and retractable, and the rotating member is rotatable; and an extension direction of the rotating member is perpendicular to an extension direction of the telescopic member.

In the embodiment of the present disclosure, the moving component 40 can drive the second end of the telescopic rod 22 to move along the extension direction of the telescopic rod, and to rotate around an axis L of the rotating rod 21, so that the temperature detector 30 provided on the second end of the telescopic rod 22 can detect the operating temperatures of the elements 01 to be detected on the PCB 00. It should be noted that, the bearing support 20 may further include: a connecting rod 23 fixedly connected with the bearing base 10, and one end of the rotating rod 21 may be fixedly connected with the connecting rod 23, so as to implement a fixed connection between the first end of the rotating rod 21 and the bearing base 10; in another optional implementation mode, the first end of the rotating rod 21 and the bearing base 10 may be directly fixedly connected with each other, which will not be limited in the embodiment of the present disclosure.

Optionally, the extension direction of the rotating rod 21 may be perpendicular to the extension direction of the telescopic rod 22, and the extension direction of the rotating rod 21 is perpendicular to a bearing surface of the bearing base 10.

In the embodiment of the present disclosure, the moving component 40 has a data receiving port 41, and the data receiving port 41 is configured to receive control data for controlling movement of the second end of the bearing support 20. Exemplarily, the control data may include: an extension length or retraction length of the telescopic rod 22, and a rotation angle of the rotating rod 21; and when the moving component 40 receives the control data through the data receiving port 41, the moving component 40 may control the telescopic rod 22 to extend or retract by a corresponding length, and control the rotating rod 21 to rotate by a corresponding angle, according to the control data.

Optionally, the bearing support includes: a first support, a first end of the first support being fixed, for example, fixed to the bearing base; and a telescopic member, a first end of the telescopic member being rotatably coupled to the first support, and a second end of the telescopic member being provided with the temperature detector.

For example, the first end of the telescopic member that is connected with the first support is rotatable with respect to the first support, for example, the first end may be sleeved on the first support so that the first end can rotate around the first support; and the moving component is coupled to the telescopic member to control the rotation angle of the telescopic member.

For example, the moving component may be a stepper motor, for example, a self-locking stepper motor; the motor may be fixed onto the first support and may be connected with the first end of the telescopic member, so as to control its rotation; and once rotating to a desired angle, the first end cannot rotate in an opposite direction, because the self-locking stepper motor connected therewith prevents it from contra-rotating, and prevents it from moving.

Optionally, the temperature detecting device further comprises: a control member, connected with the moving component, and configured to control the moving component, so that the moving component drives the second end of the bearing support to move with respect to the first end.

Exemplarily, the moving component may be a stepper motor; for example, two stepper motors may be respectively provided, arranged on the bearing support for connection convenience, and respectively connected with the rotating member and the telescopic member to respectively control rotation of the rotating member and extension and retraction of the telescopic member, or respectively control rotation of the telescopic member with respect to the first support and extension and retraction of the telescopic member.

In summary, the temperature detecting device provided by the embodiment of the present disclosure comprises: a bearing base, a bearing support, a temperature detector and a moving component. The bearing base is configured to bear the PCB to be detected, a first end of the bearing support is fixedly connected with the bearing base, and a second end may bear the temperature detector. The moving component is configured to: drive the second end of the bearing support 20 to move when the PCB is in operation, so that the temperature detector detects operating temperatures of elements to be detected on the PCB. With the temperature detecting device, the operating temperatures of the elements to be detected on the PCB may be automatically detected, so that it is neither necessary for an operator to hold an infrared thermometer in hand so as to detect the operating temperatures of the elements, nor necessary to couple a temperature sensor to each element to detect the operating temperatures of the elements through a temperature sensing line, which effectively improves efficiency in testing the PCB.

Figures 3, 4:
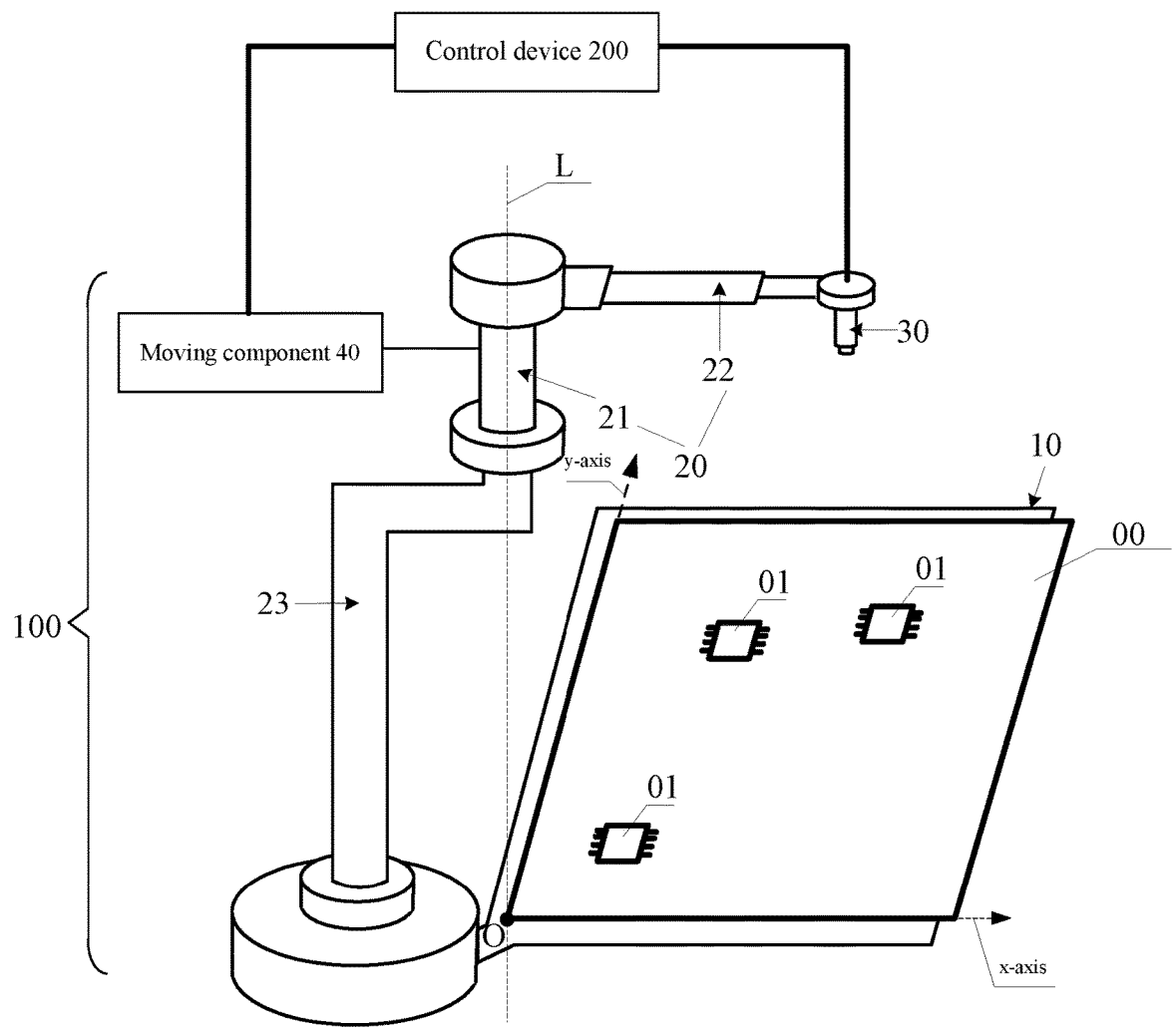
FIG. 3 is a structural schematic diagram of a temperature detecting system further provided by an embodiment of the present disclosure.
FIG. 4 is a flow chart of a temperature detecting method provided by an embodiment of the present disclosure.

FIG. 3 is a structural schematic diagram of a temperature detecting system further provided by an embodiment of the present disclosure. The temperature detecting system may comprise: a temperature detecting device 100 and a control device 200. The temperature detecting device 100 may be the temperature detecting device shown in FIG. 1 or FIG. 2, and the control device 200 may be a desktop computer, a tablet personal computer, a mobile phone, and any other device having a display function and a control function.

The control device 200 may be connected with a moving component 40 in the temperature detecting device 100. It should be noted that, the control device 200 and the moving component 40 may be connected with each other through a cable, or may also be connected through a wireless network.

The control device 200 is configured to send control data for controlling movement of a second end of a bearing support 20 to the moving component 40 when the PCB 00 is in operation.

The moving component 40 is configured to drive the second end of the bearing support 20 to move based on the control data.

In the embodiment of the present disclosure, before the control device 200 sends the control data to the moving component 40, the control device 200 needs to firstly acquire the control data. There are various modes in which the control device 200 acquires the control data, and it is schematically explained in the embodiment of the present disclosure with two implementable modes below as an example.

In a first implementable mode, after a PCB 00 to be detected is placed on a bearing base 10 in the temperature detecting device 100, positions of elements 01 to be detected on the PCB 00 may be pre-measured; and according to the positions of the elements 01 to be detected, control data corresponding to each element 01 to be detected is input into the control device 200.

If the bearing support 20 in the temperature detecting device 100 includes: a rotating rod 21 and a telescopic rod 22, wherein, an extension direction of the rotating rod 21 may be perpendicular to an extension direction of the telescopic rod 22, and the extension direction of the rotating rod 21 is perpendicular to a bearing surface of the bearing base 10, then, the control data input into the control device 200 may include: a length of the telescopic rod 22, and an included angle between the extension direction of the telescopic member 21 and one edge of the bearing base 10.

In a second implementable mode, the control device 200 is further configured to: acquire position information of the elements 01 to be detected in the PCB 00, and generate control data according to the position information.

In the embodiment of the present disclosure, the bearing base 10 in the temperature detecting device 100 has a first reference coordinate system; for example, as shown in FIG. 3, two adjacent edges in the bearing base 10 that are close to an axis L of the rotating rod 21 may be respectively taken as two axes (x-axis and y-axis) of the first reference coordinate system, and an intersection point O of the two edges is taken as an origin of the first reference coordinate system. The PCB 00 has a second reference coordinate system, and after the PCB 00 is placed on the bearing base 10, the first reference coordinate system coincides with the second reference coordinate system. The position information of the elements 01 to be detected may be coordinate information.

Optionally, the control data includes: a distance of the second end of the bearing support with respect to the coordinate origin of the first reference coordinate system and the second reference coordinate system, and an included angle between a connection line from the second end of the bearing support to the coordinate origin and a first axis in the first reference coordinate system.

Exemplarily, when the PCB 00 is designed, the design may be performed by a dedicated software installed in a personal computer, etc.; and after the design of the PCB 00 is completed, the dedicated software records the position information of the elements on the PCB 00, and identification information of an element corresponding to each piece of position information. For example, the dedicated software may be a Gerber file. It should be noted that, in a process of designing the PCB 00, any two adjacent edges of the PCB 00 may be respectively taken as two axes of the second reference coordinate system, an intersection point of the two edges is taken as an origin of the second reference coordinate system, and the position information of the elements on the PCB 00 may be coordinate information. It should also be noted that, a coordinate information value of each element according to the embodiment of the present disclosure is: coordinate information of a center point of the element.

Before the PCB 00 is detected, an operator may previously import the Gerber file in the personal computer used for designing the PCB 00 into the control device 200. For example, the personal computer and the control device 200 may each have an input/output port such as a Universal Serial Bus (USB) interface, and the Gerber file may be transferred from the personal computer to the control device 200 with a USB flash disk.

Then, the operator may select all the elements 01 to be detected through the identification information of the elements in the Gerber file acquired by the control device 200. At this time, the control device 200 can acquire the position information of the elements 01 to be detected according to the identification information of the elements 01 to be detected.

If the bearing support 20 in the temperature detecting device 100 includes: the rotating rod 21 and the telescopic rod 22, wherein, the extension direction of the rotating rod 21 may be perpendicular to the extension direction of the telescopic rod 22, the axis L of the rotating rod 21 passes through the origin of the first reference coordinate system, and the extension direction thereof is perpendicular to the bearing surface of the bearing base 10, then, the control data generated by the control device 200 according to the position information includes: the length of the telescopic rod 22, and an included angle between the extension direction of the telescopic rod 22 and one axis (for example, the x-axis) of the first reference coordinate system.

Optionally, the bearing support includes: a first support, wherein, a first end of the first support is fixed; a telescopic member, wherein, a first end of the telescopic member is rotatably coupled to the first support; in a case where the second end of the telescopic member is provided with the temperature detector, a rotation axis of the telescopic member passes through the origin of the first reference coordinate system and is perpendicular to the first reference coordinate system; and the control data includes: a length of the telescopic member, and an included angle between the extension direction of the telescopic member and the first axis of the first reference coordinate system.

In the embodiment of the present disclosure, the control device 200 is specifically configured to: calculate by using a first calculation formula to obtain the length of the telescopic rod 22, according to position information of each element 01 to be detected, and calculate by using a second calculation formula to obtain the included angle between the extension direction of the telescopic rod 22 and the x-axis in the first reference coordinate system.

The first calculation formula is: $L = \sqrt{(a^2+b^2)}$;

Where, L is the length of the telescopic rod 22, a is an x-axis coordinate in the position information of the element 01 to be detected, and b is a y-axis coordinate in the position information of the element 01 to be detected.

The second calculation formula is:

$$\alpha = \arcsin\left(\frac{|b|}{L}\right);$$

Where, α is the included angle between the extension direction of the telescopic rod 22 and the x-axis in the first reference coordinate system.

According to the above-described first calculation formula and the second calculation formula, control data corresponding to each element 01 to be detected may be calculated. With reference to Table 1, Table 1 records control data generated by the control device 200 according to position information of each element 01 to be detected.

TABLE 1

| Identification information of elements to be detected | Position information | | Control data | |
| --- | --- | --- | --- | --- |
| | | | | Included angle between extension direction of |
| | | | Length of | |
| | x-axis coordinate | y-axis coordinate | telescopic rod (mm) | telescopic rod and x-axis (°) |
| element a1 to be detected | 2080.00 | 3340.00 | 3934.72 | 58.09 |
| element a2 to be detected | 3580.00 | 3680.00 | 5134.08 | 45.79 |
| element a3 to be detected | 1320.00 | 2460.00 | 2791.77 | 61.78 |

For example, when position information of the element a1 to be detected is (2080.00, 3340.00), the control data generated according to the position information includes: the length of the telescopic rod: 3934.72 mm, and the included angle between the extension direction of the telescopic rod and the x-axis: 58.09°.

In combination with the first implementable mode and the second implementable mode as described above, after acquiring the control data, the control device 200 may send the control data to the moving component 40, so that the moving component 40 can drive the second end of the bearing support 20 to move based on the control data.

For example, the PCB 00 may include N elements 01 to be detected, where, N is a positive integer. The control device 200 is configured to sequentially send N pieces of control data in a preset order, and the N pieces of control data are in one-to-one correspondence with the N elements 01 to be detected.

The moving component 40 is configured to: control movement of the telescopic rod 22 according to current position information of the second end of the telescopic rod 22 and an Mth piece of control data, when receiving the Mth piece of control data, so that an orthogonal projection of the temperature detector 30 on the bearing surface of the bearing base 10 overlaps with an orthogonal projection of an Mth element 01 to be detected on the bearing surface, and thus the temperature detector 30 can detect an operating temperature of the Mth element 01 to be detected.

Where $M \leq N$, the current position information of the second end of the telescopic rod 22 includes: a current length of the telescopic rod 22, and a current included angle between the extension direction of the telescopic rod 22 and one x-axis (for example, the x-axis) in the first reference coordinate system.

With reference to Table 2, Table 2 records data for controlling movement of the telescopic rod 22 according to the current position information of the second end of the telescopic rod 22 and the Mth piece of control data, when the moving component 40 receives the Mth piece of control data. Wherein, the data for controlling movement of the telescopic rod 22 by the moving component 40 includes: an extend length or a retract length of the telescopic rod 22 and a rotating angle the telescopic rod 22 around the axis L of the rotating rod 21. In a process when the moving component 40 controls extension or retraction of the telescopic rod 22, it may be specified that a length when the telescopic rod 22 is controlled to extend is positive, and a length when the telescopic rod 22 is controlled to retract is negative; and in a process when the moving component 40 controls rotation around the rotating rod 21, it may be specified that an angle of rotation in a direction close to the x-axis is positive, and an angle of rotation in a direction away from the x-axis is negative.

TABLE 2

| | Data for controlling movement of telescopic rod 22 by moving component 40 | |
|---|---|---|
| Identification information of elements to be detected | Extension or retraction length of telescopic rod (mm) | Rotation angle of telescopic rod around an axis of rotating rod (°) |
| element a1 to be detected | 3934.72 | 58.09 |
| element a2 to be detected | 1199.36 | −12.30 |
| element a3 to be detected | −2342.31 | 15.99 |

For example, when the Mth element to be detected is the element a2 to be detected, if an operating temperature of the element a2 to be detected is being detected, the moving component 40 may receive control data corresponding to the element a2 to be detected, it will control the telescopic rod 22 to extend by 1191.36 mm, and control the telescopic rod 22 to rotate around the axis L of the rotating rod 21 by 12.30° in the direction away from the x-axis, according to the control data and the current position information of the second end of the bearing support 20.

It should be noted that, if the moving component 40 receives a Kth piece of control data, current position information of the second end of the bearing support 20 is movement data corresponding to a (K−1)th element to be detected, where $1 < K \leq N$; and if the moving component 40 receives a 1st piece of control data, current position information of the second end of the bearing support 20 is initial position information, and the initial position information may be stored in the moving component 40.

It should be noted that the control device 200 may further periodically send N pieces of control data to the moving component 40, so that the temperature detecting system can periodically detect the operating temperatures of the elements 01 to be detected; and in each detection period, the control device 200 sequentially sends N pieces of control data to the moving component 40 in a preset order.

Optionally, as shown in FIG. 3, the control device 200 may also be connected with the temperature detector 30. It should be noted that, the control device 200 and the temperature detector 30 may be connected with each other through a cable, or may also be connected through a wireless network.

The control device 200 is further configured to: acquire the operating temperatures of the elements 01 to be detected; judge whether or not an operating temperature of each element 01 to be detected is within a preset temperature range; and mark at least one of the element to be detected whose operating temperature is within the preset temperature range and the element to be detected whose operating temperature is not within the preset temperature range.

It should be noted that, in a process when the control device 200 sends N pieces of control data to the moving component 40, if it is necessary to send the Kth piece of control data to the moving component 40, then, when the control device 200 acquires an operating temperature of the (K−1)th element to be detected, the control device 200 can send the Kth piece of control data to the moving component 40. If the control device 200 acquires an operating temperature of the Nth element to be detected, the control device 200 also needs to send a reset instruction to the moving component 40, so that the moving component 40 can drive the second end of the bearing support 20 to move to an initial position.

For example, with reference to Table 3, Table 3 records that the control device 200 acquires operating temperatures of elements 01 to be detected, and marks an element to be detected whose operating temperature is within the preset temperature range and an element to be detected whose operating temperature is not within the preset temperature range.

TABLE 3

| Identification information of elements to be detected | 1st test | 2nd test | 3rd test | 4th test | 5th test | 6th test | 7th test | Preset temperature range | Qualified/unqualified |
|---|---|---|---|---|---|---|---|---|---|
| element a1 to be detected | 60° | 63° | 65° | 67° | 68° | 70° | 71° | 0° to 80° | Qualified |
| element a2 to be detected | 71° | 74° | 76° | 78° | 81° | 82° | 83° | 0° to 80° | Unqualified |
| element a3 to be detected | 62° | 64° | 66° | 68° | 71° | 72° | 73° | 0° to 80° | Qualified |

In the embodiment of the present disclosure, the preset temperature range may be 0° to 80°; in the process of detecting the operating temperatures of the elements to be detected by the temperature detecting system, if there is an element to be detected whose operating temperature detected is not within the preset temperature range in a process of a certain detection, the element to be detected is unqualified, and the element to be detected needs to be redesigned. For example, the operating temperature of the element to be detected a2 in the PCB 00 in the 5th detection exceeds the preset temperature range, so the design of the PCB 00 is not reasonable, and it is necessary to redesign the element to be detected a2 in the PCB 00.

It should be noted that, the temperature detecting system may perform multiple detections on the operating temperatures of the elements 01 to be detected; in each detection, the control device 200 may sequentially send N pieces of control data to the moving component 40 in a preset order. A time interval between two adjacent detections may be 1 to 4 hours, which will not be limited in the embodiment of the present disclosure.

In the embodiment of the present disclosure, the control device 200 has a display interface, and the control device 200 is further configured to: display the acquired operating temperatures of the elements 01 to be detected. Exemplarily, the control device 200 may display the operating temperatures of the elements 01 to be detected as shown in Table 3.

In summary, the temperature detecting system provided by the embodiment of the present disclosure comprises: the temperature detecting device and the control device. The control device is connected with the moving component in the temperature detecting device, the control device is configured to send the control data for controlling movement of the second end of the bearing support when the PCB is in operation, so that the temperature detector detects the operating temperatures of the elements to be detected on the PCB. With the temperature detecting system, the operating temperatures of the elements to be detected on the PCB may be automatically detected, so that it is neither necessary for an operator to hold an infrared thermometer by hand so as to detect the operating temperature of the element, nor necessary to couple a temperature sensor to the element to detect the operating temperature of the element through a temperature sensing line, which effectively improves detection efficiency of detecting the PCB.

With reference to FIG. 4, FIG. 4 is a flow chart of a temperature detecting method provided by an embodiment of the present disclosure, the method is applied to the temperature detecting system shown in FIG. 3, and the method may comprise:

Step 401: sending, by a control device, control data for controlling movement of a second end of a bearing support to a moving component, when an assembly to be detected is in operation.

Step 402: driving, by the moving component, the second end of the bearing support to move based on the control data.

Optionally, the temperature detecting device further comprises: a bearing base, configured to bear the assembly to be detected, a first end of the bearing support being fixed to the bearing base, wherein, the bearing base has a first reference coordinate system, and the assembly to be detected has a second reference coordinate system; and before the sending, by a control device, control data for controlling movement of a second end of a bearing support to a moving component, the method further comprises: causing the bearing base to move with respect to the assembly to be detected, so that the first reference coordinate system and the second reference coordinate system have coincident origins and parallel coordinate axes, or the coordinate systems coincide with each other.

For example, the bearing base may move with respect to the assembly to be detected, or the assembly to be detected may move with respect to the bearing base; for example, coordinate systems of the two may be coincident with each other when the assembly to be detected is placed.

Optionally, before the sending, by a control device, control data for controlling movement of a second end of a bearing support to a moving component, the method further comprises: acquiring position information of each element to be detected on the assembly to be detected; generating the control data according to the position information, the control data including: a distance of the second end of the bearing support with respect to the coordinate origin of the first reference coordinate system and the second reference coordinate system, and an included angle between a connection line from the second end of the bearing support to the coordinate origin and a first axis in the first reference coordinate system.

Optionally, the above-described step 401 may include:

Acquiring, by the control device, position information of elements to be detected in the assembly to be detected, and generating the control data according to the position information.

Optionally, the PCB includes N elements to be detected, and the above-described temperature detecting method may further comprise:

Step A1: sequentially sending, by the control device, N pieces of control data in a preset order, the N pieces of control data being in one-to-one correspondence with the N elements to be detected.

Step B1: controlling, by the moving component, movement of the second end of the bearing support, for example, a telescopic rod, according to current position information of the second end of the bearing support, for example, the telescopic rod, and an Mth piece of control data, when receiving the Mth piece of control data, so that an orthogonal projection of a temperature detector on a bearing surface of the bearing base overlaps with an orthogonal projection of an Mth element to be detected on the bearing surface.

Optionally, the above-described temperature detecting method may further comprise:

Step A2: acquiring, by the control device, operating temperatures of elements to be detected.

Step B2: judging, by the control device, whether or not an operating temperature of each element to be detected is within a preset temperature range.

Step C2: marking, by the control device, at least one of the element to be detected whose operating temperature is within the preset temperature range and the element to be detected whose operating temperature is not within the preset temperature range.

Optionally, the control device has a display interface, and the above-described temperature detecting method may further comprise: displaying, by the control device, the acquired operating temperatures of the elements to be detected.

For example, the assembly to be detected is a printed circuit board.

For example, the acquiring position information of each element to be detected on the assembly to be detected includes:

Acquiring position information of each element to be detected on the assembly to be detected from a file which is stored with the position information of the element to be detected on the printed circuit board; or Measuring a position of each element to be detected on the assembly to be detected to obtain position information of each element to be detected on the assembly to be detected.

For example, the assembly to be detected includes N elements to be detected, where, N is a positive integer.

The sending, by a control device, control data for controlling movement of a second end of a bearing support to a moving component, includes:

Configuring the control device to sequentially send N pieces of control data in a preset order, the N pieces of control data being in one-to-one correspondence with the N elements to be detected;

The driving, by the moving component, the second end of the bearing support to move based on the control data, includes:

Controlling movement of the second end of the bearing support, according to the current position information of the second end of the bearing support and the Mth piece of control data, when receiving the Mth piece of control data, so that the orthogonal projection of the temperature detector on the bearing surface of the bearing base overlaps with the orthogonal projection of the Mth element to be detected on the bearing surface, where $M \leq N$, The current position information of the second end of the bearing support includes: the distance of the second end of the bearing support with respect to the coordinate origin of the first reference coordinate system and the second reference coordinate system, and the included angle between the connection line from the second end of the bearing support to the coordinate origin and the first axis in the first reference coordinate system.

For example, the controlling movement of the second end of the bearing support, according to the current position information of the second end of the bearing support and the Mth piece of control data, when receiving the Mth piece of control data, so that the orthogonal projection of the temperature detector on the bearing surface of the bearing base overlaps with the orthogonal projection of the Mth element to be detected on the bearing surface, may be:

Calculating to obtain a relative rotation angle, and a relative length, for example, a relative retraction length or a relative extension length, of the second end, according to the current position information of the second end and the Mth piece of control data, so that the second end of the bearing support moves to the position of the element to be detected, for example, a center of the temperature detector of the second end coincides with a center of the element to be detected.

Alternatively, in the present disclosure, movement of the second end of the bearing support may also be controlled such that the temperature detector moves to a position, as long as the element to be detected is located within a detection scope thereof; for example, in a case of an infrared thermometer, it may move to a position as long as the element to be detected can receive an infrared ray of the infrared thermometer so that temperature measurement can be implemented; and orthogonal projections of the two do not have to overlap with each other.

The temperature detecting device provided by the technical solution of the embodiment of the present disclosure comprises: the bearing support, the temperature detector and the moving component. The first end of the bearing support is fixed, and the second end is configured to bear the temperature detector. The moving component is configured to be connected with the bearing support, wherein, the second end of the bearing support is movable with respect to the first end as driven by the moving component. For example, the moving component is configured to: drive the second end of the bearing support 20 to move when the PCB is in operation, so that the temperature detector detects the operating temperatures of the elements to be detected on the PCB. With the temperature detecting device, the operating temperatures of the elements to be detected on the assembly to be detected may be automatically detected, so that it is neither necessary for an operator to hold an infrared thermometer by hand so as to detect the operating temperature of the element, nor necessary to couple a temperature sensor to the element to detect the operating temperature of the element through a temperature sensing line, which effectively improves efficiency of detecting the PCB.

It should be noted that, the foregoing embodiment in which the structure of the temperature detecting system is described may be referred to for a principle of the above-described temperature detecting method, which will not be repeated here.

Those skilled in the art may understand that implementation of all or part of the steps of the above-described embodiments may be completed by hardware, or may also be completed by related hardware as instructed by a program; the program may be stored in a computer readable storage medium; and the above-mentioned storage medium may be a read only memory, a magnetic disk or an optical disk, and the like.

What are described above is related to the specific embodiments of the disclosure only and not limitative to the scope of the disclosure. The protection scope of the disclosure shall be based on the protection scope of the claims. Any modification and equivalent replacement may be made by those skilled in the art within the substantial protection scope of the embodiments of the present disclosure, which is regarded as falling within the protection scope of embodiments of the present disclosure.

The application claims priority to the Chinese patent application No. 201811279687.1, filed Oct. 30, 2018, the disclosure of which is incorporated herein by reference as part of the application.

The invention claimed is:

1. A temperature detecting device, comprising:
   a bearing support, a first end of the bearing support being fixed;
   a temperature detector, provided on a second end of the bearing support;
   a moving component, configured to be connected with the bearing support,
   wherein the second end of the bearing support is movable with respect to the first end under driving of the moving component,
   wherein the bearing support includes a rotating member and a telescopic member, a first end of the rotating member is fixed, a second end of the rotating member is fixedly connected with a first end of the telescopic member, and a second end of the telescopic member is configured to bear the temperature detector,
   wherein the moving component is respectively coupled to the rotating member and the telescopic member, under the driving of the moving component, the second end of the telescopic member is extendible and retractable, and the rotating member is rotatable, and an extension direction of the rotating member is perpendicular to an extension direction of the telescopic member.

2. The temperature detecting device according to claim 1, wherein the bearing support includes:
   a first support, a first end of the first support being fixed;
   a telescopic member, a first end of the telescopic member being rotatably coupled to the first support, and a second end of the telescopic member being provided with the temperature detector.

3. The temperature detecting device according to claim 2, wherein the moving component is coupled to the telescopic member, and under driving of the moving component, the second end of the telescopic member is extendible and retractable, and the second end of the telescopic member is rotatable with respect to the first support.

4. The temperature detecting device according to claim 1, further comprising:
a bearing base, configured to bear an assembly to be detected,
the first end of the bearing support being fixed to the bearing base.

5. The temperature detecting device according to claim 1, further comprising:
a control member, connected with the moving component, and configured to control the moving component, so that the moving component drives the second end of the bearing support to move with respect to the first end.

6. A temperature detecting system, comprising:
a temperature detecting device, which is the temperature detecting device according to claim 1;
a control device, connected with the moving component in the temperature detecting device, and configured to send control data for controlling movement of the second end of the bearing support to the moving component,
wherein the moving component is configured to drive the second end of the bearing support to move based on the control data.

7. The temperature detecting system according to claim 6, wherein the control device is further configured to: acquire position information of elements to be detected in an assembly to be detected, and generate control data according to the position information.

8. The temperature detecting system according to claim 7, wherein the temperature detecting device further comprises:
a bearing base, configured to bear the assembly to be detected,
a first end of the bearing support being fixed to the bearing base,
wherein the bearing base has a first reference coordinate system, the assembly to be detected has a second reference coordinate system, during a detection, the first reference coordinate system coincides with the second reference coordinate system, and the position information is coordinate information.

9. The temperature detecting system according to claim 8, wherein the control data includes: a distance of the second end of the bearing support with respect to coordinate origin of the first reference coordinate system and the second reference coordinate system, and an included angle between a connection line from the second end of the bearing support to the coordinate origin and a first axis in the first reference coordinate system.

10. The temperature detecting system according to claim 9, wherein the bearing support includes a rotating member and a telescopic member, a first end of the rotating member is fixedly connected with the bearing base, a second end of the rotating member is fixedly connected with a first end of the telescopic member, a second end of the telescopic member is configured to bear the temperature detector, and an axis of the rotating member passes through the coordinate origin of the first reference coordinate system, and is perpendicular to the first reference coordinate system;
the control data includes: a length of the telescopic member, and an included angle between an extension direction of the telescopic member and the first axis of the first reference coordinate system.

11. The temperature detecting system according to claim 10, wherein the assembly to be detected includes N elements to be detected, where N is a positive integer,
the control device is configured to sequentially send N pieces of control data in a preset order, the N pieces of control data are in one-to-one correspondence with the N elements to be detected;
the moving component is configured to: control movement of the second end of the telescopic member, according to current position information of the second end of the telescopic member and an Mth piece of control data, when receiving the Mth piece of control data, so that an orthogonal projection of the temperature detector on a bearing surface of the bearing base overlaps with an orthogonal projection of an Mth element to be detected on the bearing surface, where M≤N; and the current position information of the second end of the telescopic member includes: a current length of the telescopic member, and a current included angle between the extension direction of the telescopic member and one of axes in the first reference coordinate system.

12. The temperature detecting system according to claim 6, wherein, the control device is further connected with the temperature detector,
the control device is further configured to: acquire an operating temperature of the element to be detected;
judge whether or not the operating temperature of each of the elements to be detected is within a preset temperature range; and
mark at least one of the element to be detected whose operating temperature is within the preset temperature range and the element to be detected whose operating temperature is not within the preset temperature range.

13. The temperature detecting system according to claim 9, wherein the bearing support includes:
a first support, a first end of the first support being fixed;
a telescopic member, a first end of the telescopic member being rotatably coupled to the first support, and a second end of the telescopic member being provided with the temperature detector,
a rotation axis of the telescopic member passes through the coordinate origin of the first reference coordinate system and is perpendicular to the first reference coordinate system;
the control data includes: a length of the telescopic member, and an included angle between an extension direction of the telescopic member and the first axis of the first reference coordinate system.

14. A temperature detecting method, applied to the temperature detecting system according to claim 6, the method comprising:
sending, by the control device, control data for controlling movement of the second end of the bearing support to the moving component, when an assembly to be detected is in operation;
driving, by the moving component, the second end of the bearing support to move based on the control data.

15. The temperature detecting method according to claim 14, wherein, the temperature detecting device further comprises:
a bearing base, configured to bear the assembly to be detected,
a first end of the bearing support being fixed to the bearing base,
wherein the bearing base has a first reference coordinate system, and the assembly to be detected has a second reference coordinate system;

and before the sending, by the control device, control data for controlling movement of the second end of the bearing support to the moving component, the method further comprises:
  causing the bearing base to move with respect to the assembly to be detected, so that the first reference coordinate system coincides with the second reference coordinate system.

16. The temperature detecting method according to claim 15, before the sending, by the control device, control data for controlling movement of the second end of the bearing support to the moving component, comprising:
  acquiring position information of each of the elements to be detected on the assembly to be detected;
  generating the control data according to the position information,
  the control data including: a distance of the second end of the bearing support with respect to the coordinate origin of the first reference coordinate system and the second reference coordinate system, and an included angle between a connection line from the second end of the bearing support to the coordinate origin and a first axis in the first reference coordinate system.

17. The temperature detecting method according to claim 16, wherein the assembly to be detected is a printed circuit board, the acquiring position information of each of the elements to be detected on the assembly to be detected includes:
  acquiring position information of each of the elements to be detected on the assembly to be detected from a file which is stored with the position information of the elements to be detected on the printed circuit board; or
  measuring a position of each of the elements to be detected on the assembly to be detected to obtain position information of each of the elements to be detected on the assembly to be detected.

18. The temperature detecting method according to claim 16, wherein the assembly to be detected includes N elements to be detected, where, N is a positive integer,
  the sending, by the control device, control data for controlling movement of the second end of the bearing support to the moving component includes:
  configuring the control device to sequentially send N pieces of control data in a preset order, the N pieces of control data being in one-to-one correspondence with the N elements to be detected;
  the driving, by the moving component, the second end of the bearing support to move based on the control data includes:
  controlling movement of the second end of the bearing support, according to current position information of the second end of the bearing support and an Mth piece of control data, when receiving the Mth piece of control data, so that an orthogonal projection of the temperature detector on a bearing surface of the bearing base overlaps with an orthogonal projection of an Mth element to be detected on the bearing surface, where M≤N,
  the current position information of the second end of the bearing support includes a distance of the second end of the bearing support with respect to the coordinate origin of the first reference coordinate system and the second reference coordinate system, and the included angle between the connection line from the second end of the bearing support to the coordinate origin and the first axis in the first reference coordinate system.

* * * * *